United States Patent
Sharma et al.

(10) Patent No.: US 9,525,090 B2
(45) Date of Patent: Dec. 20, 2016

(54) FLEXIBLE PHOTOVOLTAIC ARTICLES

(75) Inventors: Rahul Sharma, Lake Jackson, TX (US); Siddharth Ram Athreya, Midland, MI (US); Xuming Chen, Pearland, TX (US); Keith L. Kauffmann, Ypsilanti, MI (US); Leonardo C. Lopez, Midland, MI (US); Kwanho Yang, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 218 days.

(21) Appl. No.: 14/118,905

(22) PCT Filed: Jun. 14, 2012

(86) PCT No.: PCT/US2012/042343
§ 371 (c)(1),
(2), (4) Date: Nov. 20, 2013

(87) PCT Pub. No.: WO2012/174179
PCT Pub. Date: Dec. 20, 2012

(65) Prior Publication Data
US 2014/0083490 A1  Mar. 27, 2014

Related U.S. Application Data

(60) Provisional application No. 61/497,124, filed on Jun. 15, 2011.

(51) Int. Cl.
*H01L 31/044* (2014.01)
*H01L 31/048* (2014.01)
*B32B 17/10* (2006.01)
*H01L 31/049* (2014.01)

(52) U.S. Cl.
CPC ..... *H01L 31/0481* (2013.01); *B32B 17/10027* (2013.01); *H01L 31/049* (2014.12); *B32B 2327/12* (2013.01); *B32B 2367/00* (2013.01); *Y02E 10/50* (2013.01)

(58) Field of Classification Search
CPC ........ H01L 31/00–31/078; Y02E 10/50–10/60
USPC .................................................. 136/243–265
See application file for complete search history.

(56) References Cited

U.S. PATENT DOCUMENTS

| 4,625,070 | A  | 11/1986 | Berman et al. |
| 6,207,603 | B1 | 3/2001  | Danielson et al. |
| 6,287,674 | B1 | 9/2001  | Verlinden et al. |
| 6,815,070 | B1 | 11/2004 | Burkle et al. |

(Continued)

FOREIGN PATENT DOCUMENTS

| EP | 2273473 A3 | 12/2011 |
| EP | 1038663 B1 | 12/2012 |

(Continued)

OTHER PUBLICATIONS

"Ultra-Slim Flexible Glass"; Corning; 2011; Corning Incorporated.

*Primary Examiner* — Bach Dinh

(57) ABSTRACT

The invention is a flexible photovoltaic article having excellent environmental barrier and mechanical protection for the photovoltaic system. The article comprises top side protective layers that include a flexible thin film glass under a top side stress relieving layer and on the opposite side of the photovoltaic cell a backside stress relieving layer.

16 Claims, 1 Drawing Sheet

(56) References Cited

U.S. PATENT DOCUMENTS

| | | |
|---|---|---|
| 2003/0113724 A1* | 6/2003 | Schembri .............. B29C 66/472 435/6.11 |
| 2003/0124341 A1 | 7/2003 | Burroughes et al. |
| 2004/0071960 A1 | 4/2004 | Weber et al. |
| 2005/0178428 A1 | 8/2005 | Laaly et al. |
| 2007/0012353 A1* | 1/2007 | Fischer ................. H01L 31/048 136/251 |
| 2007/0251572 A1* | 11/2007 | Hoya .................. C08L 23/0815 136/256 |
| 2009/0199894 A1* | 8/2009 | Hollars ................. H01L 31/048 136/251 |
| 2010/0065116 A1 | 3/2010 | Stancel et al. |
| 2010/0143676 A1* | 6/2010 | Hahn ............... B32B 17/10018 428/212 |
| 2010/0200063 A1 | 8/2010 | Djeu |
| 2010/0209716 A1 | 8/2010 | Fukatani et al. |
| 2011/0146792 A1 | 6/2011 | Wu et al. |
| 2012/0048349 A1* | 3/2012 | Metin ................ H01L 31/02013 136/251 |
| 2012/0147743 A1 | 6/2012 | Singh et al. |
| 2013/0118581 A1* | 5/2013 | Zhou ..................... B32B 27/365 136/259 |

FOREIGN PATENT DOCUMENTS

| | | |
|---|---|---|
| GB | 1319846 | 6/1973 |
| WO | 2010019829 A1 | 2/2010 |

* cited by examiner

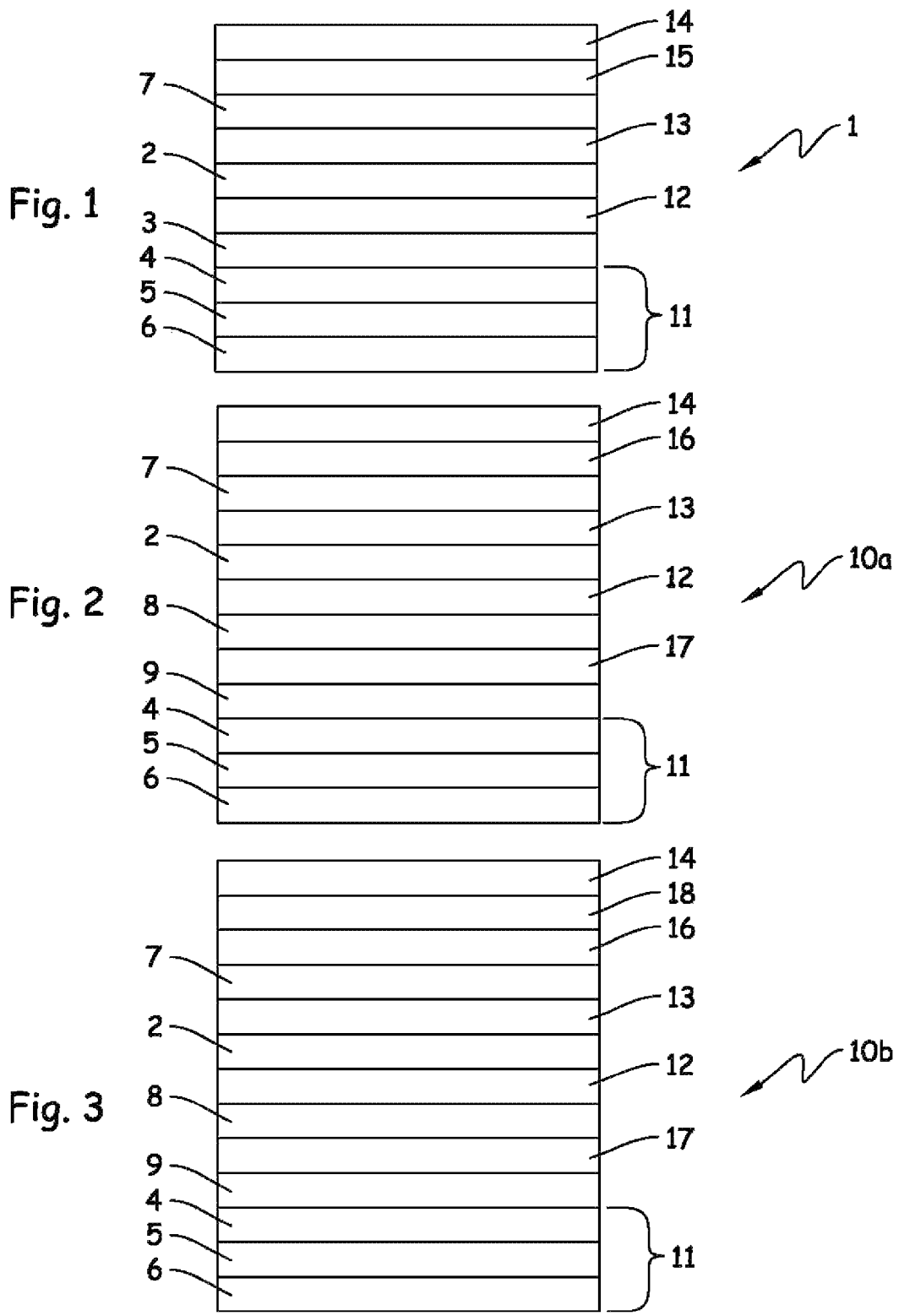

FLEXIBLE PHOTOVOLTAIC ARTICLES

CROSS REFERENCE TO RELATED APPLICATIONS

This application is a 35 USC §371 national phase filing of PCT/US2012/042343 filed Jun. 14, 2012, which claims the benefit of U.S. Application No. 61/497124, filed Jun. 15, 2011.

FIELD OF THE INVENTION

This invention relates generally to photovoltaic articles, particularly flexible photovoltaic with good environmental robustness.

INTRODUCTION

Photovoltaic devices or modules typically comprise one or more solar cells that are protected by barrier materials on the front side (the side on which light contacts the solar cell) and the backside. These barriers provide resistance to ingress of deleterious components into the device. For example, some photovoltaic cell components may need protection from moisture or oxygen due to the high sensitivity of their performance to these molecules. It is generally desirable to select barrier materials that can also provide sufficient protection to the active portions of the cell and electrical interconnect systems against environmental or mechanical stresses like impacts (e.g. hail).

Since the front side of a photovoltaic device or module must be transparent and is also more likely to be subject to impacts, there are additional constraints as to what the front side barrier materials and other front side components can be. A front side barrier that includes a relatively thick glass sheet provides excellent barrier to water and oxygen and can also be selected from a glass that can withstand impact. However, this relatively thick glass will render the device or module relatively rigid. Thus, the benefits of using certain flexible, thin film photovoltaic materials may be reduced.

The industry has struggled to find transparent, flexible materials that provide suitable moisture resistance needed for moisture sensitive photovoltaic cell systems while also providing the desired mechanical protection. Very thin flexible glass with thickness in the range of 10-500 micrometers (subsequently referred to as "microglass") has been proposed as a flexible top barrier layer. However, it is acknowledged that these materials are themselves susceptible to breakage or damage from impacts.

Examples of previous attempts to address packaging for photovoltaic cells are U.S. 2005/0178428, WO2010/019829, and U.S. application Ser. No. 12/963,172 (unpublished as of the date of filing of this application).

Thus, there remains a desire for a photovoltaic device system that provides a flexible module while also giving good environmental and mechanical protection to the photovoltaic cells.

SUMMARY OF INVENTION

To provide a better protected cell package, the present inventors have discovered a new photovoltaic article that combines the benefits of flexible photovoltaics with good moisture and oxygen barriers while providing improved mechanical protection. Specifically, the inventors have discovered that the photovoltaic cell may be damaged by impact even when no damage to a protective microglass is evident. Surprisingly, the inventors have discovered that a photovoltaic stack of a flexible support, a flexible photovoltaic system and a top barrier can be rendered more resistant to damage from impacts by using both a microglass sheet and a relatively low modulus stress relieving layer above the microglass as part of the top barrier and using a relatively high modulus stress relieving layer between the flexible photovoltaic system and the flexible support. That the addition of a stress relieving layer on the backside of the photovoltaic element leads to improved resistance and mechanical strength of the top barrier is particularly surprising.

Thus, according to one aspect, the invention is a photovoltaic article comprising:

a) a flexible backside support
b) a flexible backside stress relieving layer adhered to the flexible backside support wherein the backside stress relieving layer has an elastic modulus in the range of $10^7$ to $10^{10}$ Pa,
c) a flexible photovoltaic system adhered to the backside stress relieving layer opposite from the flexible backside support
d) a microglass sheet adhered to the flexible photovoltaic system opposite from the backside stress relieving layer, and
e) a flexible top side stress relieving layer adhered to the microglass sheet wherein the flexible top side stress relieving layer has an elastic modulus in the range of $10^4$ to $10^8$ Pa.

Elastic modulus is measured by ASTM D882 (2010) method unless otherwise noted.

BRIEF DESCRIPTION OF THE DRAWINGS

FIG. 1 is a schematic of a comparative photovoltaic article stack.

FIG. 2 is a schematic (not to scale) of one exemplary embodiment of a photovoltaic article of this invention.

FIG. 3 is a schematic (not to scale) of one exemplary embodiment of a photovoltaic article of this invention.

DETAILED DESCRIPTION

FIG. 1 shows a comparative photovoltaic article 1 outside the scope of the present invention. This article has a flexible substrate 11, shown as having a top portion 4, an adhesive layer 5, and bottom portion 6. The article has a flexible cell 12 located between two encapsulant or adhesive layers 2 and 3. The article has a microglass top barrier 13 adhered via an adhesive 7 to a polymeric layer 15 that supports and protects the microglass. A topcoat layer 14 which frequently is a fluoropolymer is shown to provide some additional protection to the cell.

Photovoltaic articles within the scope of the invention are shown in FIGS. 2 and 3.

Specifically, FIG. 2 shows a photovoltaic article 10a having a flexible substrate 11, a backside stress relief layer 17, a flexible photovoltaic cell 12, a microglass protective layer 13 over the photovoltaic cell, a topside stress relief layer 16 and an optional topcoat layer 14. Optional adhesive or encapsulant layers 2, 7, 8, and 9 are shown in this figure.

FIG. 3 shows a similar article but with the addition of an optional additional top side protective layer 18.

The Flexible Support

The backside support 11 may be a single layer or may be multiple layers. The backside support 11 is flexible and provides a barrier against ingress of environmental components such as water or oxygen that could be detrimental to the cell. Key performance criteria for barrier performance are: (i) water vapor transmission rate no greater than 0.005 g/m²-day, more preferably no greater than 0.001 g/m²-day, and most preferably no greater than 0.0005 g/m²-day, (ii) oxygen transmission rate <$10^{-9}$ cm³/m²-day-Pa. It is also necessary that the backside support prevent current leakage from the cell 12. Thus, if the support is a metal film or foil a dielectric spacer is needed between the cell and the metal foil. This could be an adhesive layer but is most desirably a polymeric film of thickness of 10 to 500 microns.

A variety of materials may be used in the flexible support 11 such as coated or uncoated metal foils, multi-layer films comprising of polymers and inorganic materials like alumina or silica, or the like. Polymeric materials alone, polymer nanoparticle nanocomposites and other polymer composites may also be used provided they provide sufficient environmental barrier.

Frequently as shown in FIGS. 1, 2, and 3, the support 11 may be a multi-layer component having metal layers and polymeric layers, where at least one of the polymer layers may serve as a dielectric spacer. A preferred metal in such supports is aluminum but other metals such as steel, stainless steel, copper or combinations thereof could be used. The thickness of the foil should be between 10-1000 μm, preferably between 50-200 μm. The dielectric spacer in such supports can consist of films of polyethylene terephthalate (PET), ethylene vinyl acetate (EVA), fluoropolymers such as polyvinyl fluoride (PVF), polyvinylidine fluoride (PVDF), ethylene tetrafluroethylne copolymer (ETFE), fluorinated ethylene propylene copolymer (FEP), (ethylene fluorinated ethylene-propylene copolymer (EFEP) or combination thereof. The total thickness of the spacer should be between 10-500 μm, preferably between 100-300 μm. Key performance criterion for dielectric spacer is that it should withstand voltage of at least 500 V, preferably 4000 V.

According to one embodiment as shown in FIGS. 1-3, a top portion 4 of the substrate provides primary barrier properties. For example, one may use a multilayer film having metal and polymer such as a Protekt™ film from Madico comprising: a multilayer structure comprising EVA, clear polyester, aluminum foil, proprietary fluoropolymer coating and proprietary laminating adhesives. The EVA layer is about 100 micron thick; the clear polyester layer is about 75 micron thick; the aluminum foil layer is about 50 microns thick; and the proprietary Protekt coating is about 13 micron thick. Another suitable material is Protekt™ TFB HD film (from Madico) which comprises a multilayer structure comprising EVA, clear polyester, aluminum foil, proprietary fluoropolymer coating and proprietary laminating adhesives. The EVA layer is about 100 micron thick; the clear polyester layer is about 250 micron thick; the aluminum foil layer is about 50 microns thick; and the proprietary coating is about 13 micron thick.

Optionally, a flexible polymer layer 6 can be added to the top portion 4 described above to provide puncture resistance. This polymer can comprise thermoplastic olefin materials, thermoplastic elastomer, olefin block copolymers ("OBC"), natural rubbers, synthetic rubbers, polyvinyl chloride, and other elastomeric and plastomeric materials. This layer 6 may be at least partially moisture impermeable and also range in thickness from about 0.25 mm to 10.0 mm, more preferably from about 0.5 mm to 2.0 mm, and most preferably from 0.8 mm to 1.2 mm. It is preferred that this layer exhibit elongation at break of about 20% or greater (as measured by ASTM D882 method); tensile strength of about 10 MPa or greater (as measured by ASTM D882 method); and tear strength of about 35 kN/m or greater (as measured with the Graves Method).

It is possible that the two main components 4 and 6 in preferred embodiments of the flexible substrate 11 do not adhere well to each other. In that instance, an adhesive layer 5 may be desired. Suitable adhesives include EVA (ethylene-vinyl-acetate), thermoplastic polyolefin, silane containing polyolefins, poly vinyl butyral (PVB), polyurethanes, ionomers, silicon based polymers or similar material silane grafted polyolefin, polyolefin copolymer with silane containing monomer, EVA, poly(vinyl butyral), ionomer, silicones, thermoplastic urethane, epoxy, acrylics, urethane acrylics, fluoroelastomers and combinations thereof. A polyolefin containing silane comonomers or functional groups, such as is available for example as DNP Z68 from Dai Nippon Printing, has been found to be particularly useful. The preferred thickness of this adhesive is in the range from about 0.1 mm to 1.0 mm, more preferably from about 0.2 mm to 0.8 mm, and most preferably from about 0.25 mm to 0.5 mm Backside Stress Relieving Layer The backside stress relieving layer 17 has an elastic modulus in the range of $10^7$ to $10^{10}$ Pa, preferably in the range of $10^8$ to $5\times10^9$ Pa. In addition, the layer preferably may have an elongation to break of at least 10%, preferably at least 25% (Elongation at break is measured according to ASTM D882 (2010) method unless otherwise noted). The thickness of this layer is preferably at least 0.05 mm, more preferably at least 0.15 mm and no more than 1.5 mm, more preferably no more than 0.75 mm. Adhesion strength of the layer to the backside of the photovoltaic cell is preferably at least >1.5 N/mm, more preferably >2.0 N/mm. If the adhesion strength is not adequate, then adhesive 8 described below may be used between the polymer and the solar cell. Adhesion strength of the polymer with the backing layer is preferably at least 1.5 N/mm, and more preferably at least 2.0 N/mm. If the adhesion strength is not adequate, then Adhesive 9 described below may be used between the polymer and the backing. Coefficient of thermal expansion of the backside stress relieving layer is preferably less than 120 ppm/° C., more preferably less than 80 ppm/° C., more preferably still less than 60 ppm/° C., even more preferably less than 30 ppm/° C. According to some embodiments, the backside stress relieving layer could be a film of a polymer having a melting point or glass transition temperature higher than 120 C, or more preferably higher than 150 C;

The adhesion strength can be measured by using 180 degree peel test. For purposes of this invention the 180 degree peel test is conducted at ambient pressure (e.g., 101 kPa) as described here to measure adhesion strength. Provide a test laminate. Measure width of the test laminate. Load the test laminate into an Instron machine 5581 at a loading rate of 2 inches (51 mm) per minute. Conduct the test at 24° C. and 50% relative humidity. Stop the test after a stable peel region is observed (typically after loading about 2 inches of test laminate). Determine peel load. Repeat 4 times. Report adhesion strength as a width-normalized average of the 5 runs of ratio of peel load to test laminate width, expressed in Newtons per millimeter.

The backside stress relieving layer 17 may be comprised of a variety of materials poly(ethylene terephthalate) (PET), poly(methyl methacrylate) (PMMA), polyamide-imide, acrylonitrile-methyl acrylate copolymer, cellulose acetate, poly(vinyl fluoride), amorphous nylon, poly(butylene terephthalate), poly(ethylene naphthalate), polyimide, polyacetal, acrylonitrile butadiene styrene copolymer (ABS), ethylene chlorotrifluoroethylene copolymer (ECTFE), poly(vinylidene fluoride), poly(ether ether ketone), poly(ether sulfone), poly(etherimide), polycarbonate, polyphenylene sulfide, ethylene vinyl alcohol copolymer (EVOH), cycloolefin polymer, cycloolefin copolymer, aromatic fluorine-containing polyarylates ionomer, epoxy, polyurethanes or combinations thereof. Other possible materials include metals, glass fiber reinforced materials, multilayers comprising of polymers and inorganic materials polymer/nanoparticle nano-composites and other polymer composites.

Adhesive 8 is preferably characterized by adhesion strengths to both the backside stress relieving layer 17 and the backside of the photovoltaic cell 12 of at least 1.5 N/mm, and more preferably at least 2.0 N/mm. Tear strength of the adhesive 8 is preferably at least 10 N/mm, more preferably at least 20 N/mm (Tear strength is measured according to Graves method unless otherwise noted). Thickness of the adhesive 8 is preferably in the range of 0.025 mm to 0.75 mm.

Adhesive 9 is preferably characterized by adhesion strengths to both the backside stress relieving layer 17 and the top side of the flexible support 11 of at least 1.5 N/mm, and more preferably at least 2.0 N/mm. Tear strength of the adhesive 9 is preferably at least 10 N/mm, more preferably at least 20 N/mm. Thickness of the adhesive 9 is preferably in the range of 0.025 mm to 0.75 mm. Examples of suitable materials for use as adhesive 8 or 9 include silane grafted polyolefin, polyolefin copolymer with silane containing monomer, EVA, poly(vinyl butyral), ionomer, silicones, thermoplastic urethane, epoxy, acrylics, urethane acrylics, fluoroelastomers and combinations thereof.

Photovoltaic System

The photovoltaic cell or system of interconnected photovoltaic cells useful in this invention are preferably flexible photovoltaic cells or interconnected systems. Examples of such systems include copper chalcogenide based cells, gallium arsenide based amorphous silicon and the like. The invention is particularly useful with flexible thin film photovoltaic cells that may be sensitive to moisture and other environmental conditions. The cells will typically have an absorber that converts light energy to electricity and an electrical connection system of backside and front side electrodes to collect or convey the electric current. Copper chalcogenide cells such as copper indium selenides or sulfides, copper indium gallium selenides or sulfides and the like are particularly preferred. The cell preferably can have encapsulant layers 2 and 8 on the front and backsides which both protect the cell and improve its adhesion to adjacent layers. Layer 8 is as described above.

Layer 2 is preferably characterized by adhesion strengths to the frontside of the photovoltaic cell 12 of at least 1.5 N/mm, and more preferably at least 2.0 N/mm. Light transmission >80%, preferably >85% and even more preferably >90%. The thickness of this layer is preferably at least 0.25 mm more preferably at least 0.75 mm and preferably not more than 2.50 mm more preferably not more than 1.50 mm.

Examples of suitable materials for use in layer 2 include silane grafted polyolefin, polyolefin copolymer with silane containing monomer, ethylene vinyl acetate (EVA), poly(vinyl butyral), thermoplastic urethane elastomer, ionomer, polyacrylates, silicone rubber or combinations thereof.

Microglass

The microglass 13 is a thin film glass that is flexible. According to one embodiment the glass must be flexible enough that the photovoltaic article including the glass layer can be wound on a core having a minimum diameter of 1 meter, more preferably a minimum diameter of 0.5 meter, and most preferably on a minimum diameter of 0.3 meter. The thin film glass preferably has a bend stress of less than 100 MPa, more preferably less than 50 MPa at a radius of bend of 25 cm or less, more preferably 15 cm or less.

The glass layer comprises materials such as conventional glass, solar glass, high-light transmission glass with low iron content, standard light transmission glass with standard iron content, anti-glare finish glass, glass with a stippled surface, fully tempered glass, heat-strengthened glass, annealed glass, or combinations thereof. In particular, flexible thin glass or micro-sheet borosilicate glass is preferred. Flexible glass is a borosilicate glass with B2O3 added to the SiO2 network for strength. An example is Corning 0211 micro-sheet borosilicate glass from Corning Inc. (USA). Its density is 2.5 g/cm3, refractive index is 1.5, and its Coefficient of Linear Thermal Expansion (CTE) is 73.8×10–7/° C. This glass is produced by a drawing process. Another example is Schott D263™ which has low levels of alkali ions from Schott Glass (Germany). Micro-glass is preferably no thinner than 0.01 mm; more preferably no thinner than 0.03 mm; and most preferably no thinner than 0.05 mm. Micro-glass can have thickness less than 0.75 mm, more preferably thickness lower than 0.5 mm and most preferably lower than 0.3 mm.

Frontside Stress Relieving Layer

The frontside stress relieving layer 16 has an elastic modulus in the range of $10^4$ to $10^8$ Pa, preferably in the range of $10^5$ to $10^7$ Pa. The thickness of this layer 16 is preferably at least 0.25 mm more preferably at least 0.75 mm and preferably not more than 2.50 mm more preferably not more than 1.50 mm. As with all the front side layers, light transmissiveness is an important quality. Light transmission at the chosen thickness is preferably at least 80%, more preferably greater than 85%, and most preferably at least 90%. Adhesion strength of layer 16 to the microglass 13 is preferably at least 1.5 N/mm, more preferably at least 2.0 N/mm. If the adhesion strength is inadequate an adhesive 7 may be used between the layer 16 and microglass 13.

Examples of suitable materials for use in layer 16 include silane grafted polyolefin, polyolefin copolymer with silane containing monomer, ethylene vinyl acetate (EVA), poly(vinyl butyral), thermoplastic urethane elastomer, poly(chlorotrifluoroethylene), poly(tetrafluoroethylene), ionomer, ethylene propylene diene monomer rubber (EPDM), polyacrylates, silicone rubber or combinations thereof.

Adhesive 7 preferably has an adhesion strength to each of layer 16 and microglass 13 of at least 1.5 N/mm, preferably at least 2.0 N/mm. The tear strength of the adhesive is preferably at least 10 N/mm, more preferably at least 25 N/mm. Thickness of adhesive 7 is preferably in the range of 0.025 mm to 0.75 mm. Light transmission at chosen thickness is preferably at least 80%, more preferably at least 85%, and most preferably at least 90%.

Examples of suitable materials for use as adhesive 7 include silane grafted polyolefin, polyolefin copolymer with silane containing monomer, ethylene vinyl acetate (EVA), poly(vinyl butyral), ionomer, silicones, thermoplastic urethane, epoxy, acrylics, urethane acrylics, fluoroelastomers and combinations thereof.

Optional Additional Front Side Protective Layers

According to one preferred embodiment as shown in FIG. 3, an additional topside protective layer 18 may be used. This polymer is preferably located over the top of stress relieving layer 16. This layer has an elastic modulus in the range of $10^7$ to $10^{10}$ Pa, preferably in the range of $10^8$ to $5\times10^9$ Pa (measured according to ASTM D882 method). Preferably, this layer is characterized by an elongation to break of at least 10%, more preferably at least 25%. Thickness of this layer is preferably at least 0.25 mm, more preferably at least 0.75 mm and preferably no more than 2.50 mm, more preferably no more than 1.50 mm. Light transmission at chosen thickness is preferably at least 80%, preferably greater than 85%, most preferably at least 90%. Adhesion strength of the polymer of this layer to layer 16 and layer 14 is preferably at least 1.5 N/mm, more preferably at least 2.0 N/mm. If the adhesion strength is inadequate, an additional adhesive (not shown in figures) may be used to increase the adhesion strength to the desired level. Light transmission of the adhesive is preferably at least 80%, preferably greater than 85%, most preferably at least 90%. Thickness of the adhesive is preferably 0.025 to 0.75 mm. Tear strength of the adhesive is preferably at least 10 N/mm, more preferably at least 25 N/mm.

Suitable materials for use as protective layer 18 include poly(ethylene terephthalate) (PET), poly(methyl methacrylate) (PMMA), polyamide-imide, acrylonitrile-methyl acrylate copolymer, cellulose acetate, poly(vinyl fluoride), amorphous nylon, poly(butylene terephthalate), poly(ethylene naphthalate), polyimide, polyacetal, ABS, ECTFE, poly(vinylidene fluoride), poly(ether ether ketone), poly(ether sulfone), poly(etherimide), polycarbonate, polyphenylene sulfide, EVOH, cycloolefin polymer, cycloolefin copolymer, ETFE, FEP, EFEP, polypropylene, ionomer or combination thereof. Suitable materials for use as the adhesive include silane grafted polyolefin, polyolefin copolymer with silane containing monomer, EVA, poly(vinyl butyral), ionomer, silicones, thermoplastic urethane, epoxy, acrylics, urethane acrylics, fluoroelastomers and combinations thereof.

Top Protecting Surface

In addition, it may be desirable to have a top protecting layer 14 preferred as an outermost layer in the invention laminates, which outermost layer can be in direct contact with the aforementioned degrading conditions or performance inhibiting conditions. Examples of performance inhibiting conditions include, for example, dirt pickup (e.g., to impart a self-cleaning capability to a photovoltaic module) or a low sunlight contact angle (e.g., to impart increased light-to-electricity efficiency to a photovoltaic module, especially for use in northern latitudes).

For a material comprising a such a top protecting layer, preferred is an organic polymer comprising a silicone, or more preferably, a fluoropolymer. This surface may be formed by treatment of the top surface or by adhesion of a separate film layer. Preferred fluoropolymers are, for example, poly(ethylene-co-tetrafluoroethylene) (ETFE); polyvinylidene fluoride (PVDF); and fluorinated ethylene propylene (FEP), EFEP, ECTFE, PTFE, PFA, THV. A protecting layer is preferred as an outermost layer in the invention laminates, which outermost layer can be in direct contact with the aforementioned degrading conditions or performance inhibiting conditions. Examples of performance inhibiting conditions include, for example, dirt pickup (e.g., to impart a self-cleaning capability to a photovoltaic module) or a low sunlight contact angle (e.g., to impart increased light-to-electricity efficiency to a photovoltaic module, especially for use in northern latitudes).

The organic polymers can further comprise additives. The invention contemplates employing additives where it is desirable to enhance or attenuate a performance property or degradation-resistance property of the invention laminates. Examples of suitable additives are ultraviolet light (UV)-absorbents, UV-stabilizers, processing stabilizers, antioxidants, cling additives, anti-blocks, anti-slips, pigments, fillers, and in-process additives.

Other Features

Since light management is important, all films or layers on the front side (i.e. light receiving side) of the photovoltaic cell layer 12 should have good light transmission, preferably at least 80%, more preferably at least 85%, more preferably still at least 90% and most preferably at least 95%. In addition, to minimize reflection at the interfaces of layer the difference in refractive indices of adjacent layers is preferably <0.2, more preferably less than 0.1, and most preferably less than 0.05.

The structure of this invention may be made by laminating or coating layers on each other or combinations of coating and laminating. The invention photovoltaic articles can be manufactured by any suitable laminating method and under any suitable laminating conditions. Each organic polymer layer of the invention laminates can be extruded, calendered, solution cast, injection molded, or otherwise applied to (placed in contact with) a surface of an immediately adjacent layer. In an illustrative lamination process to build structure of FIG. 2, flexible substrate 11, backside stress relief layer 17, cell 12, microglass protective layer 13, topside stress relief layer 16 can be laminated simultaneously. Optionally, adhesive or encapsulant layers 2, 7, 8 and 9 may be incorporated and laminated simultaneously. Optionally, optional topcoat layer 14 may be added to the prior structures and laminated simultaneously.

Alternatively, topside stress relief layer 16, microglass protective layer 13 may be applied together in an separate step through extrusion, calendering, solution casting, injection molding, or otherwise applied to (placed in contact with) one another. Optionally, optional top coat 14 may be applied in this separate step. Optionally, optional adhesive or encapsulant layer 7 may be incorporated in this step. In a subsequent process, the structure generated in the first step may be combined with cell 12, backside stress relief layer 17 and flexible substrate 11 to form the invention photovoltaic article. Optionally, adhesive or encapsulant layers 2, 8 and 9 may be included in forming the invention photovoltaic article in the second step process.

Alternatively, topside stress relief layer 16, microglass protective layer 13 may be applied together in an separate step through extrusion, calendering, solution casting, injection molding, or otherwise applied to (placed in contact with) one another to form a topside structure. Optionally, optional top coat 14 may be applied in this separate step. Optionally, adhesive or encapsulant layer 7 may be incorporated in this step. In a separate step, cell 12, backside stress relief layer 17 and flexible substrate 11 can be combined to form a backside substructure. Optionally, adhesive or encapsulant layers 8 and 9 may be included in this step. In a final step, the topside structure and backside structure are combined to form the invention photovoltaic article. Optionally, adhesive layer 9 may be included in this step to form the invention photovoltaic article.

EXAMPLES

Example 1

Three sets of samples corresponding to FIGS. 1, 2 and 3 are prepared using the following materials:
Top stress relieving layer 16: 30 mil (762 microns) DNP Z68 poly(ethylene-co-vinyltrimethoxysilane) copolymer from Dai Nippon Printing Company.
Optional top protective layer 18: 30 mil (762 microns) thick available as Zeonor 1600 from Zeon Chemicals.

Backside stress relieving layer 17: 12.5 mil (318 microns) thick Mylar polyethylene terephthalate sheet available from Tekra Corporation.

Topside protective layer 14: 2 mil (51 micron) thick film of poly(ethylene-co-tetrafluoroethylene) available from Asahi Glass Company.

Microglass is a 0.2 mm thick glass available from Corning Inc. The adhesive and encapsulant layers, 2, 5, and 7, are a 15 mil (381 microns) thick film of DNP Z68 poly(ethylene-co-vinyltrimethoxysilane) copolymer available from Dai Nippon Printing Company. Layers 8 and 9 are the same material with a thickness of 7.5 mil (191 microns).

The photovoltaic cell is a 1 mil (25 micron) thick copper indium gallium selenide CIGS cell is a solar cell available from Global Solar Energy Inc.

Layer 4 is PROTEKT TFB, a PV backsheet laminate available from Madico Inc.

Layer 6 is TPO, a 45 mil (1143 microns) thick thermoplastic olefin film available from Firestone Building Products.

The layers are prepared according to the following procedure: Each polymer film/sheet except TPO is cut into 7 inch×11 inch (178 mm×279 mm) pieces. TPO sheet is cut into 8 inch×11 inch pieces (203 mm×279 mm). The layers are assembled as shown in the figures (0.5 inch TPO was left overhanging both sides in the width direction). The stack is placed in an Orion vacuum laminator set at 150° C. for preparing the laminates. First the stack are kept under vacuum for 5 minutes. Then the pressure is ramped up at "medium rate" to 60 kPa and maintained there for 3 minutes. Finally the pressure is ramped up at "fast rate" to 101 kPa and held there for 12 minutes. Thereafter, the laminates are taken out of the laminator and allowed to cool to room temperature.

Efficiencies of the cells in all the laminates are measured using a Spire SPI-SUN Simulator 4600. Prior to making this measurement the laminates are exposed to 1000 W/m$^2$ of irradiance for 48 hours (light soaking) to stabilize their electric behavior.

Ten laminates of each design are then tested for hail impact using spherical ice balls of 1 inch (25.4 mm) diameter moving at a velocity of 23 m/s according to IEC 61646 methods. If no visual damage is observed after the impact, another impact was made. If no visible damage was observed even after the second impact a third impact was made. Cell efficiencies are measured again after the impact (s). The ratio of post-impact cell efficiency to pre-impact cell efficiency was calculated for each laminate and multiplied by 100 to determine % cell efficiency retained post impacts.

As shown in Table 1, 50% of the ten laminates of the comparative structure of FIG. 1 tested for hail impact show visual damage to microglass just after the first impact and only 10% maintain integrity of microglass (visually) after all three impacts. Moreover, after impact the cell efficiencies reduced by over 50% in 60% of the laminates. This indicates severe damage to the microglass and CIGS layers. In contrast, 90% of the ten tested laminates of the structure of FIG. 2 showed no visible damage to glass even after the third impact and all laminates maintained >95% cell efficiency after impact. These results confirm impact resistance of both the microglass and CIGS cells layer is significantly improved by addition of the backside polymer stress relief layer in combination with the frontside microglass and frontside stress relief layer.

TABLE 1

Results of hail impact testing of Structures of FIGS. 1 and 2.

| Laminate No. | Impact 1 | Impact 2 | Impact 3 | Cell Efficiency Retained Post Impacts (%) |
|---|---|---|---|---|
| FIG. 1 | | | | |
| 1 | No Visible Damage | Visible Damage | — | 32.5 |
| 2 | No Visible Damage | Visible Damage | — | 13.7 |
| 3 | No Visible Damage | Visible Damage | — | 32.0 |
| 4 | Visible Damage | — | — | 38.5 |
| 5 | No Visible Damage | No Visible Damage | No Visible Damage | 98.9 |
| 6 | No Visible Damage | Visible Damage | — | 98.9 |
| 7 | Visible Damage | — | — | 47.8 |
| 8 | Visible Damage | — | — | 39.7 |
| 9 | Visible Damage | — | — | 99.6 |
| 10 | Visible Damage | — | — | 99.6 |
| FIG. 2 | | | | |
| 1 | No Visible Damage | No Visible Damage | No Visible Damage | 99.6 |
| 2 | No Visible Damage | No Visible Damage | No Visible Damage | 99.2 |
| 3 | No Visible Damage | No Visible Damage | No Visible Damage | 98.7 |
| 4 | No Visible Damage | No Visible Damage | Visible Damage | 99.6 |
| 5 | No Visible Damage | Visible Damage | — | 100 |
| 6 | No Visible Damage | No Visible Damage | No Visible Damage | 99.5 |
| 7 | No Visible Damage | No Visible Damage | No Visible Damage | 100 |
| 8 | No Visible Damage | No Visible Damage | No Visible Damage | 98.9 |
| 9 | No Visible Damage | No Visible Damage | No Visible Damage | 99.0 |
| 10 | No Visible Damage | No Visible Damage | No Visible Damage | 99.2 |

Example 2

The benefits of the inventive structure are further verified by modeling using finite element analysis the stresses generated in the microglass and solar cell layers of the structures of FIGS. 1-3. The maximum stresses generated in microglass and CIGS cell layers are listed below and in Table 2 for each design. It is clear that the addition of backside stress reliving layer reduces the maximum stresses generated in both microglass and CIGS cell layers. Further reduction in stresses is achieved by adding the top side stress relieving layer. This lowering of stresses is hypothesized to be responsible for the higher impact resistance of microglass and CIGS cells.

The details (thickness, Young's modulus and Poisson's ratio) of the various layers in the FEA model of FIG. 1 are as follows:

Layer 14: thickness of 2 mils (50.8 microns), Youngs modulus of 330 MPa, Poisson's ratio of 0.33

Layer 15: thickness of 30 mils (762 microns), Youngs modulus of 53.7 MPa, Poisson's ratio of 0.45

Layer 7: thickness of 15 mils (381 microns), Youngs modulus of 53.7 MPa, Poisson's ratio of 0.45

Layer 13: thickness of 200 microns, Youngs modulus of 77.24 GPa, Poisson's ratio of 0.22
Layer 2: thickness of 15 mils (381 microns), Youngs modulus of 53.7 MPa, Poisson's ratio of 0.45
Layer 12: thickness of 1 mil (25.4 microns), Youngs modulus of 196 GPa, Poisson's ratio of 0.284
Layer 3 thickness of 15 mils (381 microns), Youngs modulus of 53.7 MPa, Poisson's ratio of 0.45
Layer 4 thickness of 300 microns, Youngs modulus of 950 MPa, Poisson's ratio of 0.33
Layer 5: thickness of 15 mils (381 microns), Youngs modulus of 53.7 MPa, Poisson's ratio of 0.45
Layer 6: thickness of 45 mils (1143 microns), Youngs modulus of 167.63 MPa, Poisson's ratio of 0.35

The details (thickness, Young's modulus and Poisson's ratio) of the various layers in the FEA model of FIG. 2 are as follows:

Layer 14: thickness of 2 mils (50.8 microns), Youngs modulus of 330 MPa, Poisson's ratio of 0.33
Layer 16: thickness of 30 mils (762 microns), Youngs modulus of 53.7 MPa, Poisson's ratio of 0.45
Layer 7: thickness of 15 mils (381 microns), Youngs modulus of 53.7 MPa, Poisson's ratio of 0.45
Layer 13: thickness of 200 microns, Youngs modulus of 77.24 GPa, Poisson's ratio of 0.22
Layer 2: thickness of 15 mils (381 microns), Youngs modulus of 53.7 MPa, Poisson's ratio of 0.45
Layer 12: thickness of 1 mil (25.4 microns), Youngs modulus of 196 GPa, Poisson's ratio of 0.284
Layer 8: thickness of 7.5 mil (190.5 microns), Youngs modulus of 53.7 MPa, Poisson's ratio of 0.45
Layer 17: thickness of 10 mil (254 microns), Youngs modulus of 3 GPa, Poisson's ratio of 0.35
Layer 9: thickness of 7.5 mils (190.5 microns), Youngs modulus of 53.7 MPa, Poisson's ratio of 0.45
Layer 4 thickness of 300 microns, Youngs modulus of 950 MPa, Poisson's ratio of 0.33
Layer 5: thickness of 15 mils (381 microns), Youngs modulus of 53.7 MPa, Poisson's ratio of 0.45
Layer 6: thickness of 45 mils (1143 microns), Youngs modulus of 167.63 MPa, Poisson's ratio of 0.35

The details (thickness, Young's modulus and Poisson's ratio) of the various layers in the FEA model of FIG. 3 are as follows:

Layer 14: thickness of 2 mils (50.8 microns), Youngs modulus of 330 MPa, Poisson's ratio of 0.33
Layer 18: thickness of 30 mils (762 microns), Youngs modulus of 3 GPa, Poisson's ratio of 0.35
Layer 16: thickness of 30 mils (762 microns), Youngs modulus of 53.7 MPa, Poisson's ratio of 0.45
Layer 7: thickness of 15 mils (381 microns), Youngs modulus of 53.7 MPa, Poisson's ratio of 0.45
Layer 13: thickness of 200 microns, Youngs modulus of 77.24 GPa, Poisson's ratio of 0.22
Layer 2: thickness of 15 mils (381 microns), Youngs modulus of 53.7 MPa, Poisson's ratio of 0.45
Layer 12: thickness of 1 mil (25.4 microns), Youngs modulus of 196 GPa, Poisson's ratio of 0.284
Layer 8: thickness of 7.5 mil (190.5 microns), Youngs modulus of 53.7 MPa, Poisson's ratio of 0.45
Layer 17: thickness of 10 mil (254 microns), Youngs modulus of 3 GPa, Poisson's ratio of 0.35
Layer 9: thickness of 7.5 mils (190.5 microns), Youngs modulus of 53.7 MPa, Poisson's ratio of 0.45
Layer 4 thickness of 300 microns, Youngs modulus of 950 MPa, Poisson's ratio of 0.33
Layer 5: thickness of 15 mils (381 microns), Youngs modulus of 53.7 MPa, Poisson's ratio of 0.45
Layer 6: thickness of 45 mils (1143 microns), Youngs modulus of 167.63 MPa, Poisson's ratio of 0.35

TABLE 2

| FIG. No. | Predicted Maximum Stress in Microglass (MPa) | Predicted Maximum Stress in CIGS Cells (MPa) |
| --- | --- | --- |
| 1 | 418 | 442 |
| 2 | 405 | 361 |
| 3 | 295 | 273 |

What is claimed is:

1. A photovoltaic article comprising:
a) a multi-layer flexible backside support
b) a flexible backside stress relieving layer adhered to the flexible backside support wherein the backside stress relieving layer has an elastic modulus in the range of $10^7$ to $10^{10}$ Pa,
c) a flexible photovoltaic system adhered to the backside stress relieving layer opposite from the flexible backside support
d) a microglass sheet adhered directly to the flexible photovoltaic system by an adhesive layer on a side of the photovoltaic system opposite from the backside stress relieving layer, and
e) a flexible top side stress relieving layer adhered directly to the microglass sheet by an adhesive layer wherein the flexible top side stress relieving layer has an elastic modulus in the range of $10^4$ to $10^8$ Pa and
f) a fluoropolymer topsheet.

2. The article of claim 1 further comprising an additional topside protecting layer adhered to the topside stress relieving layer opposite from the microglass layer wherein the additional topside protecting layer has an elastic modulus in the range of $10^7$ to $10^{10}$ Pa.

3. The article of claim 2 wherein the additional top side protecting layer has an elongation to break of at least 10%.

4. The article of claim 2 wherein the fluoropolymer topcoat is adhered to the additional topside protecting layer.

5. The article of claim 1 wherein the flexible photovoltaic system comprises copper chalcogenide photovoltaic cells.

6. The article of claim 1 wherein the coefficient of thermal expansion of the backside stress relieving layer is less than 120 ppm/degree C.

7. The article of claim 1 where thickness of the flexible glass film is in the range of 10-500 μm.

8. The article of claim 1 where thickness of the backside stress relieving layer is in the range of 0.05-1.5 mm.

9. The article of claim 1 where thickness of the topside stress relieving layer is in the range of 0.25-2.50 mm.

10. The article of claim 1 wherein every film or layer on the front side of the photovoltaic cell layer have light transmission of at least 80%.

11. The article of claim 1 herein the flexible backside stress relieving layer has an elongation to break of a least 10%.

12. The article of claim 1 wherein at least one adhesive layer has an adhesive strength of at least 1 N/mm.

13. The article of claim 1 wherein the backside stress relieving layer comprises a material selected from the group consisting of poly(ethylene terephthalate) (PET), poly(methyl methacrylate) (PMMA), polyamide-imide, acrylonitrile-methyl acrylate copolymer, cellulose acetate, poly (vinyl fluoride), amorphous nylon, poly(butylene terephathalate), poly(ethylene naphthalate), polyimide, polyacetal, acrylonitrile butadiene styrene copolymer (ABS), ethylene chlorotrifluoroethylene copolymer (ECTFE), poly(vinylidene fluoride), poly(ether ether ketone), poly(ether sulfone), poly(etherimide), polycarbonate, polyphenylene sulfide, ethylene vinyl alcohol copolymer (EVOH), cycloolefin polymer, cycloolefin copolymer, aromatic fluorine-containing polyarylates ionomer, epoxy, polyurethanes or combinations thereof.

14. The article of claim 1 wherein the frontside stress relieving layer comprises a material selected from the group consisting of silane grafted polyolefin, polyolefin copolymer with silane containing monomer, ethylene vinyl acetate (EVA), poly(vinyl butyral), thermoplastic urethane elastomer, poly(chlorotriafluoroethylene), ionomer, ethylene propylene diene monomer rubber (EPDM), polyacrylates, silicone rubber or combinations thereof.

15. The article of claim 1 wherein the backside stress relieving layer comprises a polymer having a melting point or a glass transition temperature greater than 120 degrees C.

16. The article of claim 1 wherein the backside flexible support comprises a layer of metal, an adhesive and a layer of fluoropolymer.

* * * * *